(12) United States Patent
Hoefel et al.

(10) Patent No.: US 7,158,049 B2
(45) Date of Patent: Jan. 2, 2007

(54) WIRELESS COMMUNICATION CIRCUIT

(75) Inventors: Albert Hoefel, Sugar Land, TX (US); Jaideva Goswami, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 442 days.

(21) Appl. No.: 10/249,223

(22) Filed: Mar. 24, 2003

(65) Prior Publication Data

US 2004/0189487 A1    Sep. 30, 2004

(51) Int. Cl.
    G01V 3/00    (2006.01)
    H04H 9/00    (2006.01)
    H04B 11/00   (2006.01)
    H04B 1/18    (2006.01)
    E21B 47/00   (2006.01)

(52) U.S. Cl. ............................. 340/855.7; 340/855.6; 340/855.8; 340/855.9; 340/854.3; 340/854.4; 455/73; 73/152; 73/152.49

(58) Field of Classification Search ............ 340/855.7, 340/856.3, 856.2, 854.6, 854.4, 854.8, 855.6, 340/855.8, 855.9, 854.3; 73/152.46, 152, 73/152.49; 324/369, 333, 342; 343/719, 343/720, 850; 455/78, 291, 205, 737; 330/277, 330/302, 303, 323

See application file for complete search history.

(56) References Cited

U.S. PATENT DOCUMENTS

| | | | |
|---|---|---|---|
| 3,018,373 A * | 1/1962 | Nygaard | 455/193.1 |
| 3,227,954 A * | 1/1966 | Fichter, Jr. | 455/82 |
| 3,231,834 A | 1/1966 | Watanabe | |
| 3,541,450 A | 11/1970 | Harrison | |
| 4,103,241 A * | 7/1978 | Najork | 455/272 |
| 4,170,755 A * | 10/1979 | Mansson | 324/238 |
| 4,314,378 A * | 2/1982 | Fowler et al. | 455/291 |
| 4,453,269 A * | 6/1984 | Skar | 455/129 |
| 4,525,863 A * | 6/1985 | Stites | 455/83 |
| 4,794,622 A | 12/1988 | Isaacman et al. | |
| 5,136,264 A * | 8/1992 | Nardozza | 332/102 |
| 5,214,409 A * | 5/1993 | Beigel | 340/572.1 |
| 5,442,340 A * | 8/1995 | Dykema | 340/825.22 |
| 6,028,534 A | 2/2000 | Ciglenec et al. | |
| 6,070,662 A | 6/2000 | Ciglenec et al. | |
| 6,173,793 B1 | 1/2001 | Thompson et al. | |
| 6,234,257 B1 | 5/2001 | Ciglenec et al. | |
| 6,253,848 B1 | 7/2001 | Reimers et al. | |
| 6,275,681 B1 * | 8/2001 | Vega et al. | 455/41.1 |
| 6,408,943 B1 | 6/2002 | Schultz et al. | |
| 6,429,784 B1 | 8/2002 | Beique et al. | |
| 6,467,387 B1 | 10/2002 | Espinosa et al. | |
| 2001/0022540 A1 | 9/2001 | Hill | |

(Continued)

Primary Examiner—Jeffery Hofsass
Assistant Examiner—Sisay Yacob
(74) Attorney, Agent, or Firm—Matthias Abrell; Victor H. Segura; William B. Batzer

(57) ABSTRACT

The invention includes a wireless communication circuit and a method of communicating with wireless signals that feature a tank circuit having an inductor connected in parallel with a capacitor circuit. The capacitor circuit includes a pair of capacitors coupled in series. Each of the capacitors is connected in common to ground and has a capacitive value associated. A feedback network is connected to selectively bias the tank circuit to produce a signal having an amplitude. The amplitude of the signal is a function of a ratio of the capacitive values associated with the capacitor circuit. The frequency of the signal is defined by the inductor and the capacitor circuit. The tank circuit is multifunctional in that it may be biased to function as a transmitter and a receiver.

25 Claims, 9 Drawing Sheets

U.S. PATENT DOCUMENTS

| | | |
|---|---|---|
| 2002/0064206 A1 | 5/2002 | Gysling et al. |
| 2002/0140572 A1 | 10/2002 | Gardner et al. |
| 2002/0153136 A1 | 10/2002 | Kruspe et al. |
| 2002/0154028 A1 | 10/2002 | Beique et al. |
| 2002/0167418 A1 | 11/2002 | Goswami et al. |
| 2002/0171560 A1 | 11/2002 | Ciglenec et al. |
| 2002/0179364 A1 | 12/2002 | Bussear et al. |

* cited by examiner

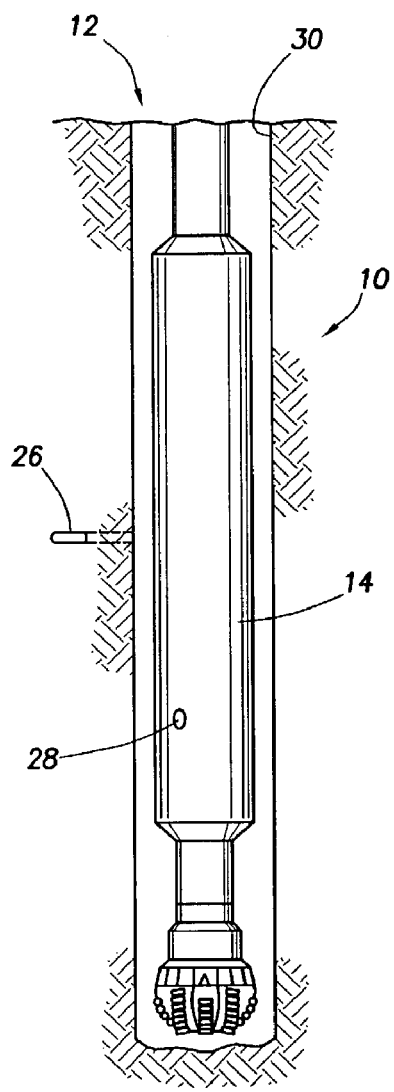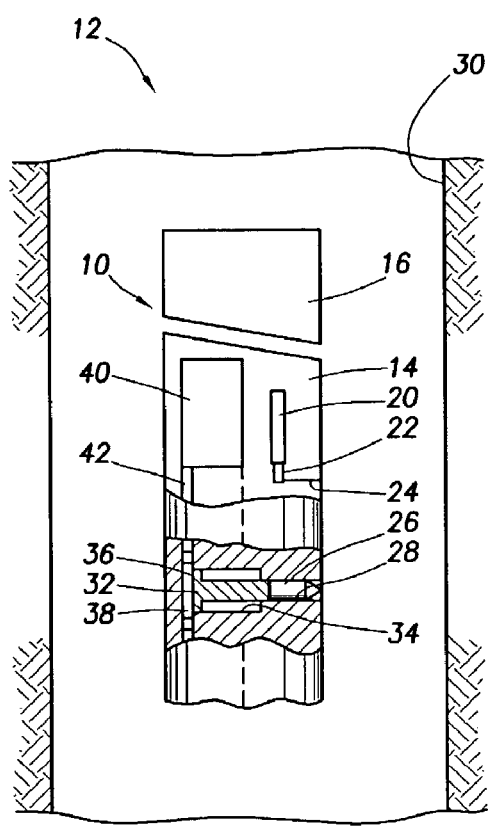
FIG.1
FIG.2

WIRELESS COMMUNICATION CIRCUIT

BACKGROUND OF INVENTION

The invention relates generally to analysis of geologic formations in furtherance of exploitation of hydrocarbon reservoirs present therein. More particularly, the present invention is directed to a wireless communication circuit suited for use in analysis of geologic formations.

Geologic formations defining a reservoir for the accumulation of hydrocarbons in the sub-surface of the earth contain a network of interconnected paths in which fluids are disposed that ingress or egress from the reservoir. To determine the nature and behavior of the fluids in the aforementioned network, knowledge of the geologic formation is desired, such as, reservoir pressure and the permeability of the reservoir rock. Present day operations analyze these characteristics either through wireline logging via a "formation tester" tool or through drill stem tests. Both types of tests are suitable for use with "open-hole" or "cased-hole" applications. However, these tests do not afford real-time data acquisition, because it is required to perform the tests once the drilling equipment has been removed from the hole, referred to as a trip.

A trip typically involves removing the drill string from the well bore, running a formation tester into the well bore to acquire the formation data, and, after retrieving the formation tester, running the drill string back into the well bore for further drilling. As is evident "tripping the well" reduces throughput and, as such, is typically avoided. As a result, data acquisition usually occurs when it is convenient, e.g., during a drill bit change, or when the drill string is being removed for some other drilling unrelated reason, or when data acquisition is sufficiently important to justify a supplemental trip.

Obtaining reservoir formation data on a "real time" basis is desired and beneficial. As a result, there has been prior art attempts to acquire various formation data from a sub-surface zone of interest while the drill string is present within the well bore. One prior art attempt is disclosed by Ciglenec et al. in U.S. Pat. No. 6,028,534, which is assigned to the assignee of the present invention. Ciglenec et al. disclose a remote sensor containing sensor instrumentation and associated electronics that is ballistically deployed into a formation. The electronics contained in the remote sensor facilitate data transfers between the sensor and an adjacent collar that is rotating. To that end, the electronics allow determining the desired spatial orientation between the collar and the sensor before data communication occurs.

A need exists, therefore, to provide electronics suitable for use in wireless communication circuits deployed in geologic formations.

SUMMARY OF INVENTION

The invention includes a communication circuit and a method of communicating with wireless signals that features providing a tank circuit having an inductor connected in parallel with a capacitor circuit. The inductor is the antenna of the communication circuit and, therefore, always operates in resonance, even when the tank circuit components change with temperature. The antenna can, therefore, operate at a high Q with minimal power consumption when transmitting. The capacitor circuit includes a pair of capacitors coupled in series. Each of the capacitors is connected in common to ground and has a capacitive value associated. A feedback network is connected to selectively bias the tank circuit to produce a signal, while minimizing the power required to produce the signal. The feedback circuit operates to maximize the amplitude swing of the signal produced across the antenna. The single ended amplitude of the signal on each side of the antenna is a function of a ratio of the capacitive values associated with the capacitor circuit, with the frequency of the signal being defined by the inductor and the capacitor circuit. The tank circuit is multifunctional in that it may be biased to function as a transmitter and/or a receiver. Additionally, the tank circuit may be augmented with additional circuits that more clearly define the transmission or reception frequency, as well as to provide a remote power source for the same. These and other embodiments are discussed more fully below.

BRIEF DESCRIPTION OF DRAWINGS

FIG. 1 is a diagram of a drill collar positioned in a borehole and equipped with a steerable transceiver unit in accordance with the present invention;

FIG. 2 is a schematic illustration of the steerable transceiver unit of the drill collar of FIG. 1 showing a system for emplacing a remote sensor from the borehole into a selected sub-surface formation;

DETAILED DESCRIPTION

Figure 3:
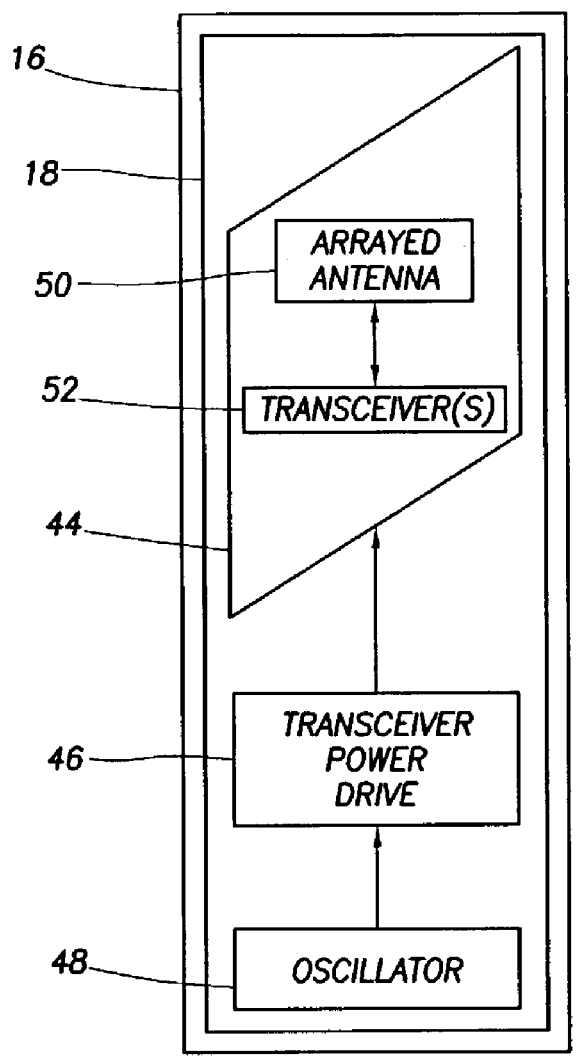
FIG. 3 schematically diagrams the electronic circuitry of the steerable transceiver unit of the drill collar of FIG. 1 for receiving data signals from and transmitting signals to the remote sensor.

Referring to FIG. 1, an exemplary use of the present invention involves a drill collar 10 that includes a drill string (not shown) for drilling a well bore 12. Drill collar 10 is provided with a sonde section 14 including a data acquisition circuit 16, shown in FIG. 2, incorporating transmitter/receiver circuitry 18 of FIG. 3.

Referring to FIG. 2, drill collar 10 includes a pressure gauge 20 whose pressure sensor 22 is exposed to borehole pressure in well bore 12 via a drill collar passage 24. Pressure gauge 20 senses ambient pressure at the depth of a selected sub-surface formation and is used to verify pressure calibration of remote sensors. Electronic signals (not shown)

representing ambient well bore pressure are transmitted via pressure gauge 20 to the circuitry of data acquisition circuit 16. Data acquisition circuit 16 then performs a pressure calibration of a remote sensor 26, shown best in FIG. 1, being deployed at that particular well bore depth.

Drill collar 10 is also provided with one or more remote sensor receptacles 28, also shown in FIG. 1. Each sensor receptacle 28 contains a remote sensor 26 for positioning within a selected sub-surface formation of interest intersected by well bore 12. As will be discussed further below, remote sensor 26 is positioned, in this particular embodiment, while well bore 12 is being drilled. Note, however, that remote sensor 26 may be previously emplaced and used in conjunction with the steerable transceiver unit of the present invention. In such embodiments, efforts will typically need to be made to identify the location of remote sensor 26, as is discussed more fully below.

Remote sensors 26 are encapsulated "intelligent" sensors that are moved from drill collar 10 to a position within the formation surrounding well bore 12. Remote sensors 26 sense formation characteristics such as pressure, temperature, rock permeability, porosity, conductivity, and dielectric constant, among others. Remote sensors 26 are appropriately encapsulated in a sensor housing of sufficient structural integrity to withstand damage during movement from drill collar 10 into laterally embedded relation with the sub-surface formation surrounding well bore 12.

Referring again to FIG. 1, a single remote sensor 26 is shown embedded in a formation in a roughly perpendicular orientation relative to well bore 12 and, hence, drill collar 10. Those skilled in the art having the benefit of this disclosure will appreciate that such lateral embedding movement need not be perpendicular to well bore 12, but may be accomplished through numerous angles of attack into the desired formation position. Sensor deployment can be achieved utilizing one or more of the following: (1) drilling into borehole wall 30 and placing remote sensor 26 into the formation; (2) punching/pressing the encapsulated remote sensors 26 into the formation with a hydraulic press or other mechanical penetration assembly; or (3) shooting remote sensors 26 into the formation by utilizing propellant charges. Any of these techniques are suitable, depending on the implementation. For instance, although the illustrated embodiment uses a hydraulic mechanism (discussed more fully below), an alternative embodiment emplaces remote sensor 26 ballistically, discussed more fully in U.S. Pat. No. 6,467,387 to Espinosa et al., which is assigned to the assignee of the present invention. U.S. Pat. No. 6,467,387 is incorporated by reference herein.

Referring again to FIG. 2, a hydraulically energized ram 32 deploys remote sensor 26, causing the same to penetrate the sub-surface formation to facilitate sensing characteristics of the formation. For sensor deployment, drill collar 10 is provided with an internal cylindrical bore 34 within which is positioned a piston element 36 having ram 32 disposed in driving relation with the encapsulated remote intelligent sensor 26. Piston element 36 is exposed to hydraulic pressure communicated to a piston chamber 38 from a hydraulic system 40 via a hydraulic supply passage 42. Hydraulic system 40 is selectively activated by data acquisition circuit 16 so that remote sensor 26 can be calibrated with respect to ambient borehole pressure at formation depth, as described above. Remote sensor 26 can then be moved from receptacle 28 into the formation beyond borehole wall 30 so that formation pressure characteristics will be free from borehole effects.

Referring now to FIG. 3, data acquisition circuit 16 of drill collar 10, shown in FIG. 1, includes a transceiver unit 44 driven by a transceiver power drive 46 (e.g., a power amplifier) at a frequency determined by an oscillator 48. Transceiver unit 44 will receive signals that will be transmitted to sonde section 14 of drill collar 10 by remote sensor 26 as will be explained more fully below. Note that the 2:1 ratio is not necessary to the practice of the invention, and that other ratios may be employed. Transceiver unit 44 includes an arrayed antenna 50 and one or more transceivers 52, depending on the implementation.

Figure 4:
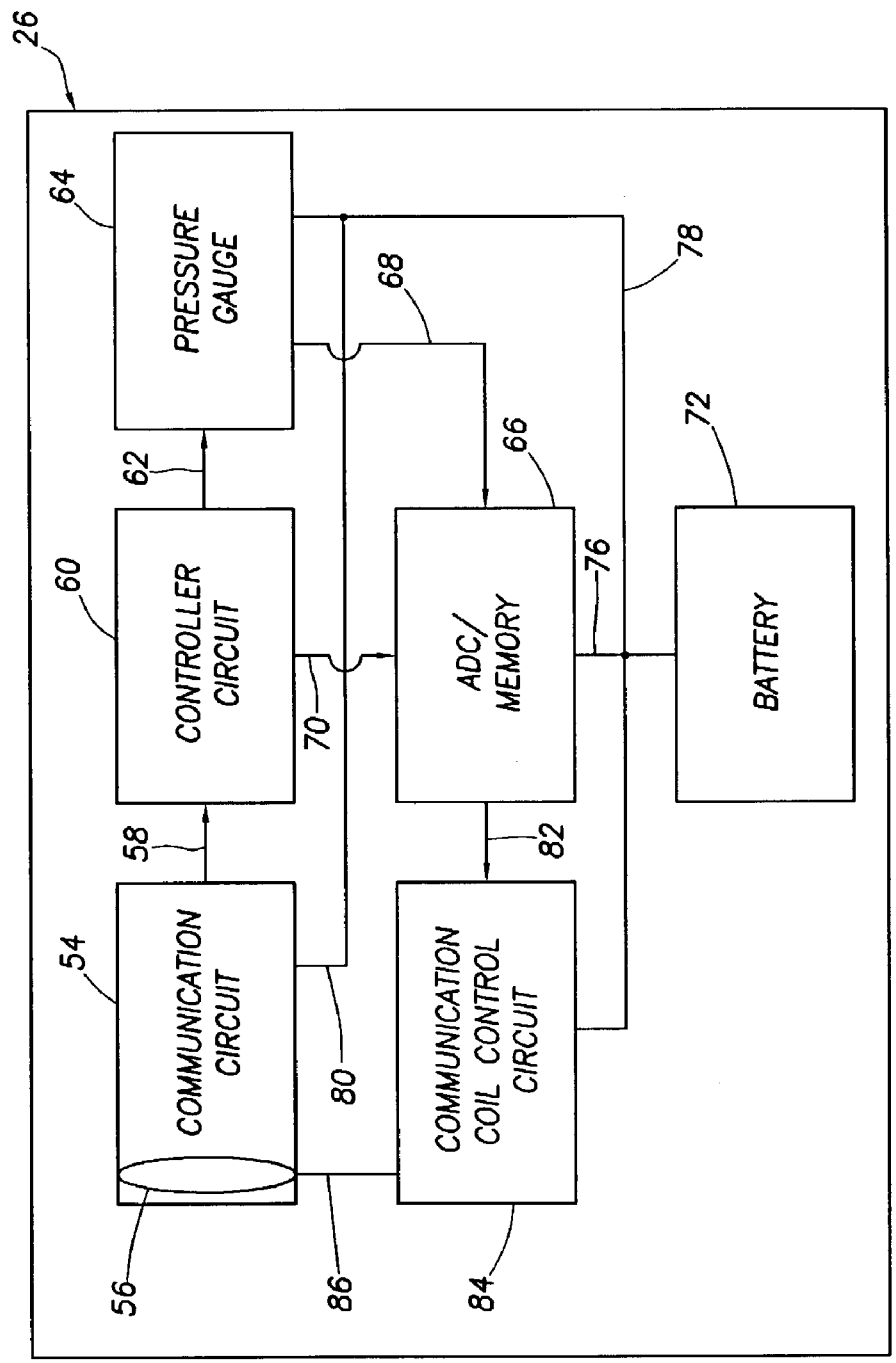
FIG. 4 is an electronic block diagram schematically illustrating the electronics of a remote sensor.

With reference to FIG. 4, the electronic circuitry of remote sensor 26, shown in FIG. 1, includes a communication circuit 54 having at least one receiver coil 56 or RF antenna. An output 58 of communication circuit 54 is connected to a controller circuit 60. Controller circuit 60 is provided with one of its controlling outputs 62 being fed to a pressure gauge 64 so that gauge output signals will be conducted to an analog-to-digital converter ("ADC")/memory 66, which receives signals from pressure gauge 64 via a conductor 68 and also receives control signals from controller circuit 60 via a conductor 70. A battery 72 is connected to the various circuitry components of sensor 26 by power conductors 76, 78 and 80. A memory output 82 of ADC/memory circuit 66 is fed to a receiver coil control circuit 84. Receiver coil control circuit 84 functions as a driver circuit via conductor 86 for antenna 56 to transmit data to transmitter/receiver circuitry 18, shown in FIG. 3.

Figure 5:
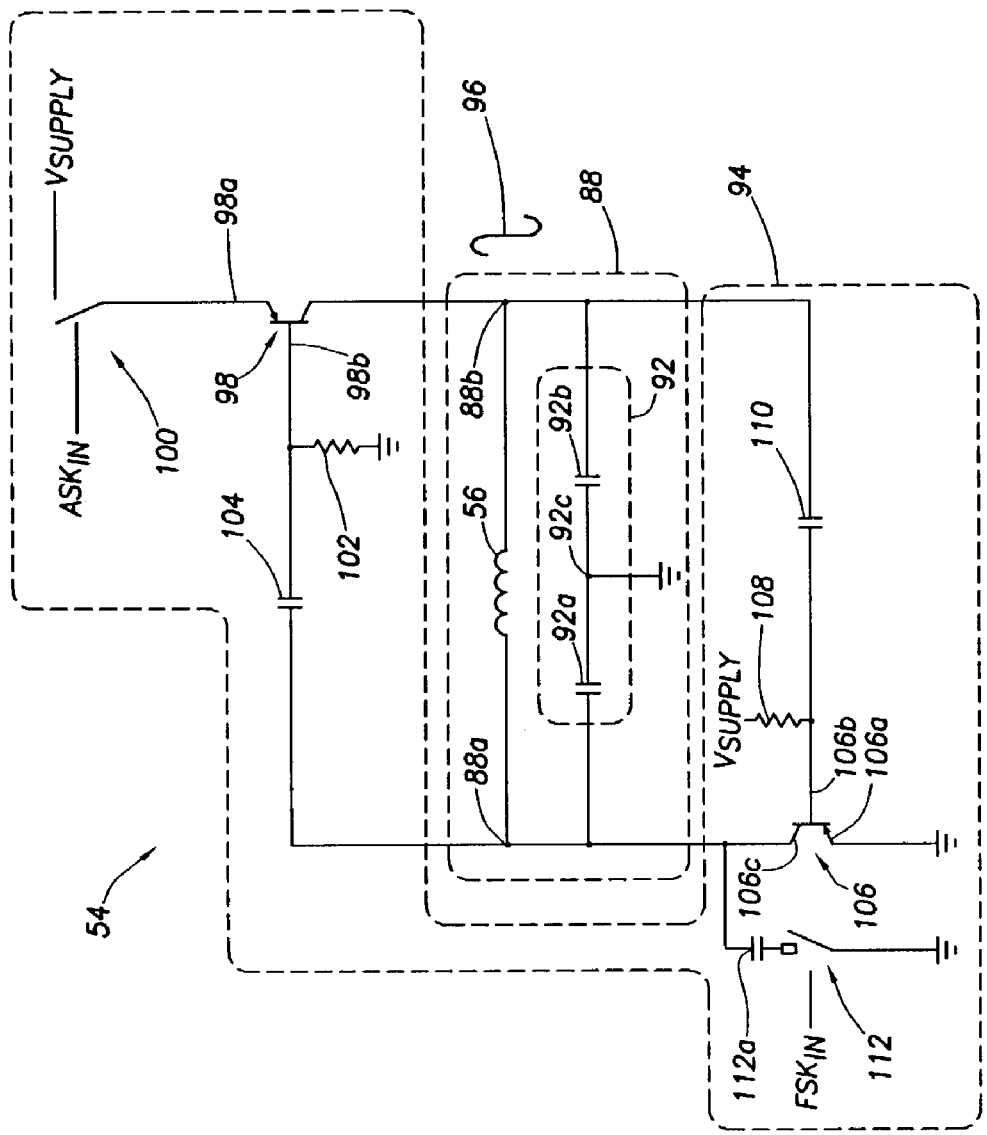
FIG. 5 is a schematic illustration of a communication circuit shown in FIG. 4 in accordance with a first embodiment.

Referring to FIG. 5, in one embodiment, communication circuit 54 is formed from a tank circuit 88 that includes antenna 56 connected in parallel with a capacitor circuit 92. Capacitor circuit 92 includes a pair of capacitors, shown as capacitors 92a and 92b, which are coupled in series. Capacitors 92a and 92b are connected in common to ground, shown at 92c. A feedback network 94 is also included in communication circuit 54. Feedback network 94 is connected to selectively bias tank circuit 88 to produce one or more signals, shown as signal 96, at ports 88a and 88b, respectively.

Feedback network 94 includes first and second feedback circuits. The first feedback circuit includes a bi-polar transistor 98, an emitter 98a of which is connected to one pole of a switch 100. The remaining poles of switch 100 are connected to $V_{SUPPLY}$ and an input $ASK_{IN}$. A base 98b of transistor 98 is connected in common with a resistor 102 and a capacitor 104. Resistor 102 is connected in series between base 98b and ground 92c. Capacitor 104 is connected in series between base 98b and port 88a of tank circuit 88. The second feedback circuit includes a bi-polar transistor 106, an emitter 106a of which is connected to ground. A base 106b of transistor 106 is connected in common with a resistor 108 and a capacitor 110. Resistor 108 is connected in series between base 106b and $V_{SUPPLY}$. A collector 106c of transistor 106 is connected to one pole of a switch 112 through a capacitor 112a, with collector 106c and capacitor 112a being connected in common with port 88a of tank circuit 88. The remaining poles of switch 112 are connected to ground and input $FSK_{IN}$. Capacitor 110 is connected in series between base 106b and port 88b of tank circuit 88.

With this configuration antenna 56 functions as the inductor of tank circuit 88, which allows communication circuit 54 to always operate at a desired resonant frequency, i.e. antenna 56 is always in resonance with tank circuit 88. As a result, the stabilization time of communication circuit 54 is minimized, thereby increasing data throughput while minimizing the power required to transmit data. The resonant frequency of communication circuit 54 is dominated by the value of antenna 56 and capacitance circuit 92. Transistors 98 and 106 and capacitors 104 and 110 of the first and second feedback circuits, respectively, implement a feedback loop of tank circuit 88. Specifically, each of the first and second feedback circuits provides 360° of feedback to tank circuit 88. When activated, resistor 102 forward biases transistor 98 of the first feedback circuit, and resistor 108 forward biases transistor 106 of the second feedback circuit. The result is that a maximum voltage across antenna 56 is obtained at ports 88*a* and 88*b*, due to the 180° inversion of the signal across antenna 56. Understanding that transistors 98 and 106 conduct for only a very short period of time, the power consumed to generate the maximum voltage across antenna 56 is minimal.

The ratio $C_1/C_2$ of the values of capacitors 92*a* and 92*b* define the balance of tank circuit 88, and the amplitudes of signal 96, where $C_1$ is the value of capacitor 92*a* and $C_2$ is the value of capacitor 92*b*. Were the values $C_1$ and $C_2$ substantially equal, tank circuit 88 operates in a balanced state and then the amplitudes of the signal across antenna 56 would be substantially equal, oscillating between ground and $V_{supply}$. Without the values $C_1$ and $C_2$ being equal, tank circuit 88 operates in an unbalanced state resulting in the amplitude of the signal across antenna 56 being different. Regardless, of whether tank circuit 88 operates in a balanced or imbalanced state, the differential voltage level of the signal across antenna 56, measured at ports 88*a* and 88*b*, is relatively unaffected. As a result, the data transfer power is the same at ports 88*a* and 88*b*, i.e. power loss is minimized. Thus, communication circuit 54 is suitable for use as both a differential mode transmitter and a common mode receiver, discussed more fully below.

The first feedback circuit facilitates data communication employing amplitude shift keying (ASK) techniques. To that end, switch 100 is activated to connect emitter 98*a* to input $ASK_{IN}$. A signal sensed at input $ASK_{IN}$ activates and deactivates tank circuit 88 thereby providing the transmission current in antenna 56. In this manner, signal 96 produced by antenna 56 is encoded to include information received at $ASK_{IN}$. For example, pressure gauge 64, shown in FIG. 4, may transmit a signal to input $ASK_{IN}$. This causes tank circuit 88 to transmit signals 96 in response thereto, thereby transmitting information obtained from pressure gauge 64 to a receiver (not shown) remotely disposed with respect to communication circuit 54. In one embodiment the information from pressure gauge 64 is digital.

Alternatively, signal 96 may be encoded to contain information employing frequency shift keying (FSK) techniques with the second feedback circuit. To that end, tank circuit 88 is switched to oscillate continuously using switch 100 to connect emitter 98*a* to $V_{SUPPLY}$. A signal, such as one generated by pressure gauge 64, may be sensed on input $FSK_{IN}$. The signal at $FSK_{IN}$ selectively connects capacitor 112*a* in parallel with capacitor 92*a*, thereby changing the resonant frequency of tank circuit 88. In this manner, signal 96 may be produced to transmit information present at $FSK_{IN}$.

Figure 6:
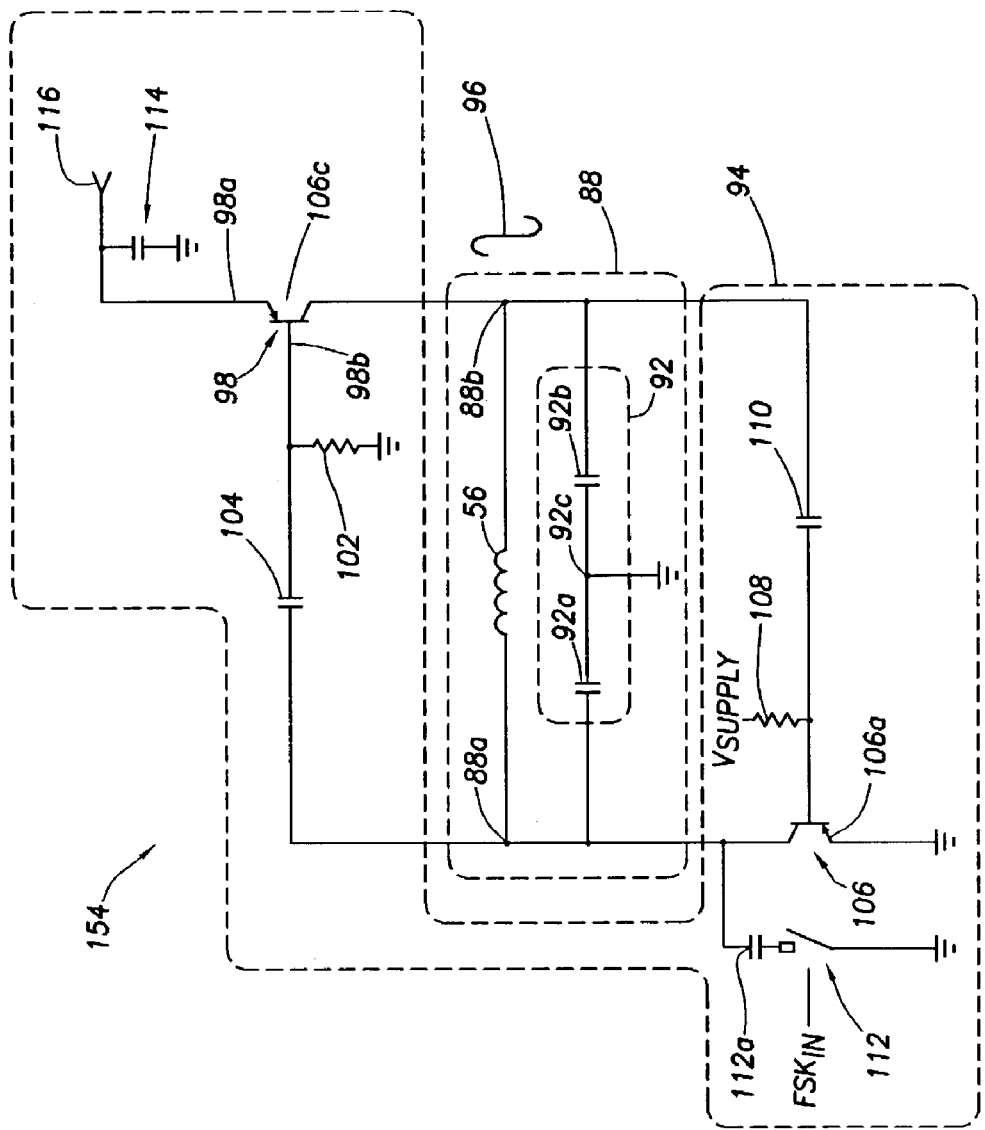
FIG. 6 is a schematic illustration of a communication circuit shown in FIG. 4 in accordance with a second embodiment.

Referring to FIG. 6, with minor modifications to the first feedback circuit, communication circuit 154 may function as a receiver for signals modulated employing ASK techniques. To that end, a rectifying capacitor 114 is connected between emitter 98*a* and ground. The common connection between emitter 98*a* and rectifying capacitor 114 defines input port 116 to which a power switch could be connected and operated remotely through reception of a wake-up signal, as is well known in the art.

When a signal having an amplitude that is greater than the base emitter threshold of transistor 98 is received at port 88*b*, transistor 98 operates in inverse mode. As a result, rectifying capacitor 114 is charged through the collector base diode of transistor 98, when the signal at port 88*b* is high. Rectifying capacitor 114 is charged to the same voltage level present at port 88*b* minus the collector base saturation voltage of transistor 98. As the voltage level of signal 96 at port 88*b* drops and the voltage level of signal 96 at port 88*a* rises, the voltage at base 98*b* becomes positive relative to the voltage at collector 106*c*. This bias arrangement of transistor 98 stops the collector-emitter current and prevents the voltage at emitter 98*a* from dropping until no further signal is sensed by antenna 56.

Figure 7:
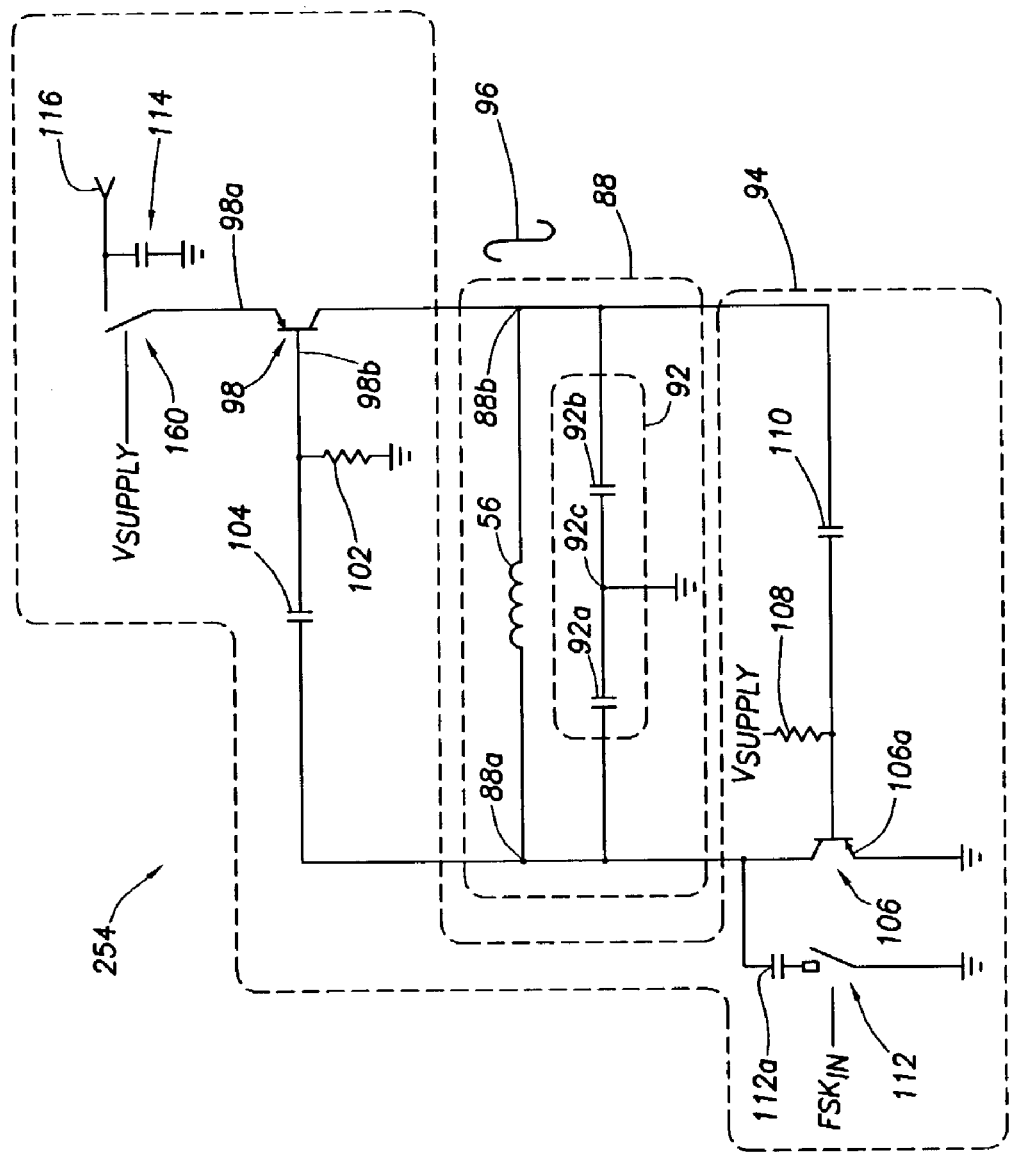
FIG. 7 is a schematic illustration of a communication circuit shown in FIG. 4 in accordance with a third embodiment.

Referring to FIG. 7, the function of communication circuit 254 may be changed between transmitter and receiver by coupling one pole of a switch 160 to emitter 98*a*, with the remaining two poles of switch 160 being coupled to $V_{SUPPLY}$ and rectifying capacitor 114. In this manner, communication circuit 254 may function as a transmitter by coupling emitter 98*a* to $V_{SUPPLY}$ using switch 160 and transmitting FSK techniques mentioned above. To have communication circuit 254 function as a receiver, switch 160 is positioned to couple emitter 98*a* to rectifying capacitor 114 and operate as discussed above with respect to FIG. 6.

Figure 8:
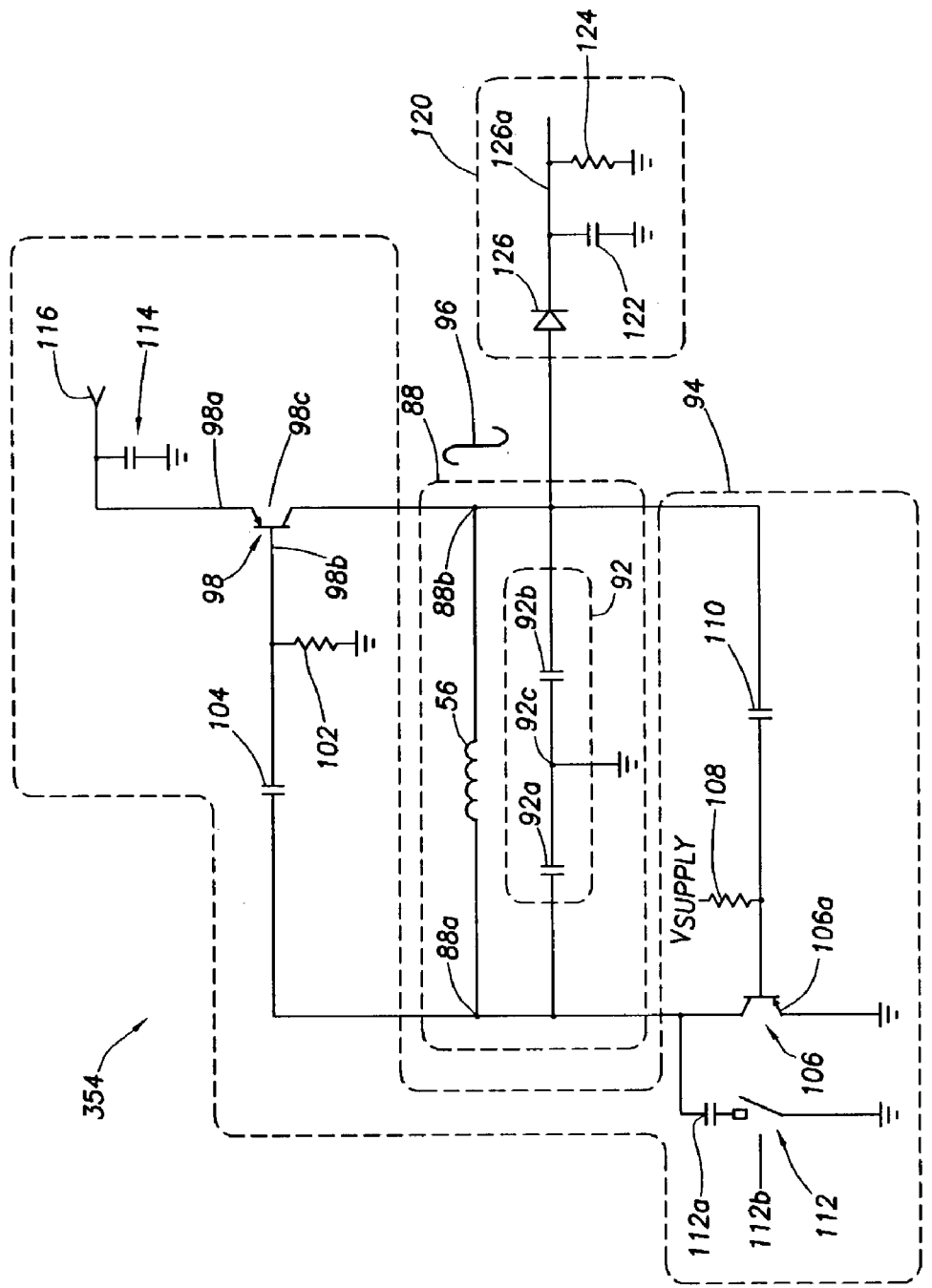
FIG. 8 is a schematic illustration of a communication circuit shown in FIG. 4 in accordance with a fourth embodiment.

Referring to FIG. 8, another embodiment of communication circuit 354 includes an envelope demodulator 120 connected in common with antenna 56 and capacitor 92*b*. Envelope demodulator 120 includes a rectifying capacitor 122 and a resistor 124 connected in parallel between ground and a cathode of a diode 126. An anode of diode 126 is connected in common with antenna 56 and capacitor 92*b* of tank circuit 88. Tank circuit 88 has greatest sensitivity to signals sensed by antenna 56 when the values of capacitors 92*a* and 92*b* are selected to place tank circuit 88 in an unbalanced state, e.g., with capacitor 92*a* having a value much greater than the value of capacitor 92*b*. This provides signal 96 at port 88*a* with a voltage level, relative to ground, that is much larger than the voltage level of signal 96 at port 88*b*. This facilitates the detection of much smaller signals, compared to the receiver configuration discussed above with respect to FIG. 6. If desired, a comparator may be connected between the cathode of diode 126 and resistor 124 at point 126*a* to cover the rectified signal into a logic signal.

Figure 9:
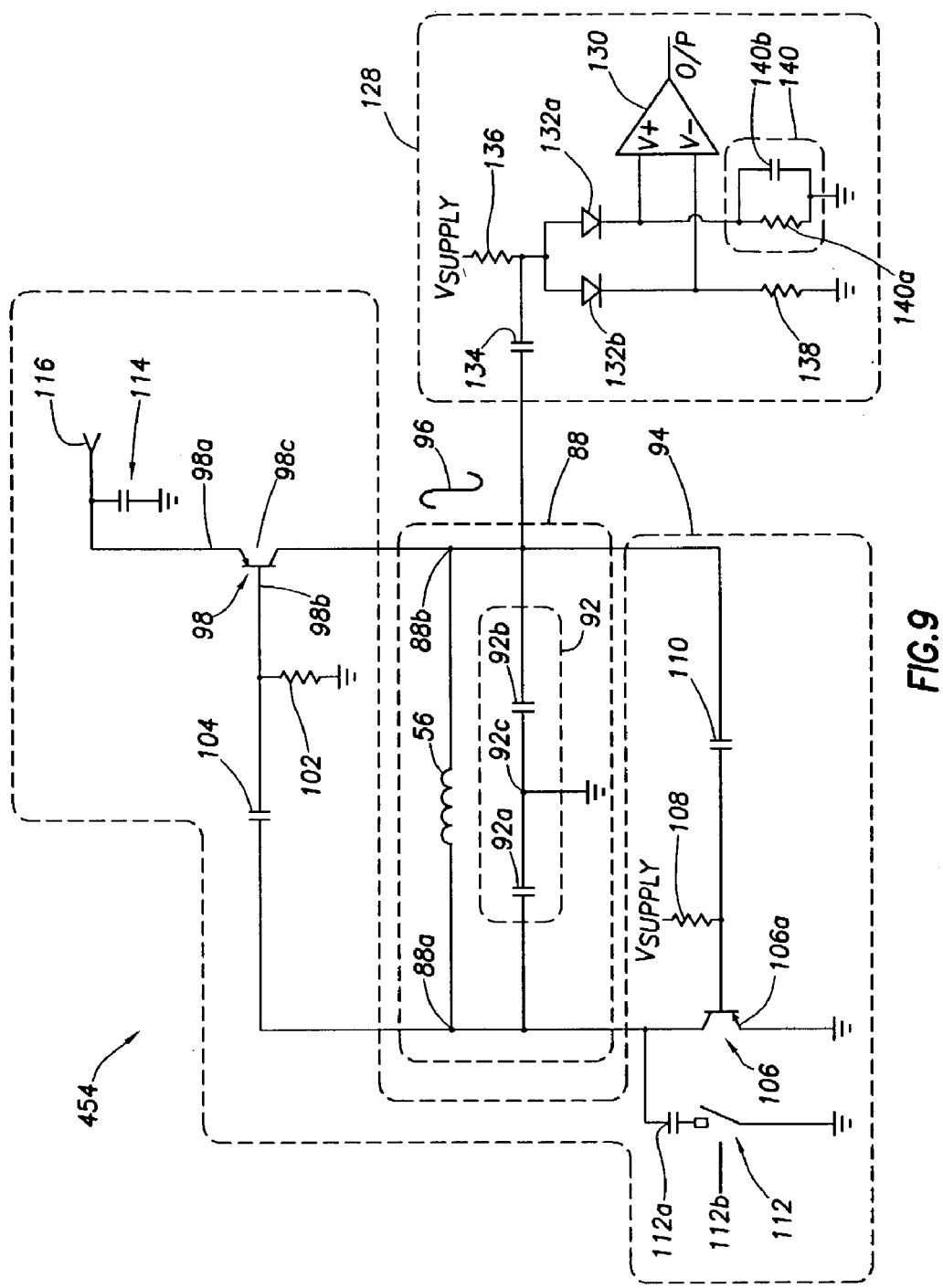
FIG. 9 is a schematic illustration of a communication circuit shown in FIG. 4 in accordance with a fifth embodiment.

Referring to FIG. 9, to increase the sensitivity of communication circuit 454 when operating as a receiver, a matched pair diode circuit 128 connected in common with capacitor 92*b* and antenna 56. Matched-pair diode circuit 128 includes an operational amplifier 130 and first and second diodes 132*a* and 132*b*, the anodes of which are connected in common with a coupling capacitor 134 and a bias resistor 136. A resistor 138 is connected in series between the cathode of diode 132*b* and ground, with the cathode of diode 132*a* being connected in common with an inverting input of operational amplifier 130 and resistor 138. An RC network 140, which includes a resistor 140*a* connected in parallel with a capacitor 140*b*, is connected in series between ground and a cathode of diode 132*a*. The cathode of diode 132*a* and RC network 140 is connected in common with a non-inverting, V+, input of operational amplifier 130.

Referring to both FIGS. 4 and 9, an exemplary embodiment, the value of resistor 138 is slightly greater than the value of resistor 140*a*. In the absence of a signal at antenna 56, a voltage drop across diode 132*a* is larger than the voltage drop across diode 132*b*, because of a slightly higher forward bias current. The voltage rises with the bias current. When a signal is sensed by antenna 56, the signal is rectified by diode 132*a* and not by diode 132*b*. Operational amplifier 130 ignores the AC component of the signal at the inverting, V⁻, input. The DC voltage at the V⁻ input of operational amplifier 130 is then greater than the DC voltage at the V⁺ input of operational amplifier 130. As a result, the operational amplifier 130 changes state. When the signal at antenna 56 terminates, capacitor 140*b* discharges and the operational amplifier 130 returns to its initial state. In this manner, digital signals are produced at an output, O/P, of operational amplifier 130 in response to signals sensed by antenna 56. The signals at O/P may be transmitted to controller circuit 60 for further processing. By providing the match diode configuration, operational amplifier 130 may operate at a low frequency, e.g., in the KHz range and, therefore, low power/low bandwidth operational amplifiers may be employed to provide significant power saving benefits. To increase the sensitivity of receiver circuit 128, an additional pre-amplifier (not shown) may be connected so that capacitor 134 is connected in common to the inputs thereof and the output of the pre-amplifier (not shown) is connected in common to the anodes of diodes 132*a* and 132*b*.

An additional advantage with matched diode pair circuit 128 is that the same provides relative stability when subjected to temperature cycling, i.e., the differential voltage, the voltage at the V⁺ input minus the voltage at the V⁻ input, is relatively independent of temperature. The bias currents of diode 132*a* and 132*b* are $I_1$ and $I_2$. The value of capacitor 140*b* and resistor 138 are $R_1$ and $R_2$, respectively. The ratio $I_1/I_2$ is defined by the ratio of $R_1/R_2$. As a result, the difference in the forward bias voltages of diodes 132*a* and 132*b*, $\Delta V_D$, may be defined as follows:

$$\frac{R_4}{R_5} = \frac{I_S\left(e^{\frac{U_{D1}}{\eta U_T}} 1\right)}{I_S\left(e^{\frac{U_{D2}}{\eta U_T}} 1\right)} \approx e^{\frac{\Delta V_D}{\eta U_T}}$$

(1) solving for $\Delta V_D$ from equation 1 provides the following:

$$\Delta V_D = \eta U_T \ln\left(\frac{R_4}{R_5}\right)$$

(2) where η is the emission coefficient which in the present example is η≈2 for forward biased diodes. The variable $U_T$ is defined as follows:

$$U_T = \frac{kT}{q}. \qquad (3)$$

Assuming that the operating temperature of tank circuit 88 is between 300K and 450K, we find values of $U_T$ as follows:

$$U_r(300K) \approx 26\ mV \qquad (4)$$

$$U_r(450K) \approx 39\ mV \qquad (5)$$

It is desired to have the minimum detection input threshold voltage below the maximum input offset voltage. Assuming that the input offset voltage of operational amplifier 130 is less than 3 mV, a ratio of $R_1/R_2$ may be defined as follows:

$$\Delta V_D \approx 3\ mV = 52\ mV nl\left(\frac{R_4}{R_5}\right)$$

(6), which yields the following:

$$\frac{R_4}{R_5} \approx e^{\frac{3mV}{52mV}} \approx 1.06. \qquad (7)$$

Thus, with a 6% resistor mismatch ratio in the example shown above with respect to equations (1) through (7) provides $\Delta V_D$ with a value of be 3 mV at 300K and 4.5 mV at 450K. As shown, the differential voltage $\Delta V_D$ is very stable over this temperature range. The small increase of the threshold may be a desired result, because the input offset voltage of operational amplifiers in general tends to rise with temperature.

Figure 10:
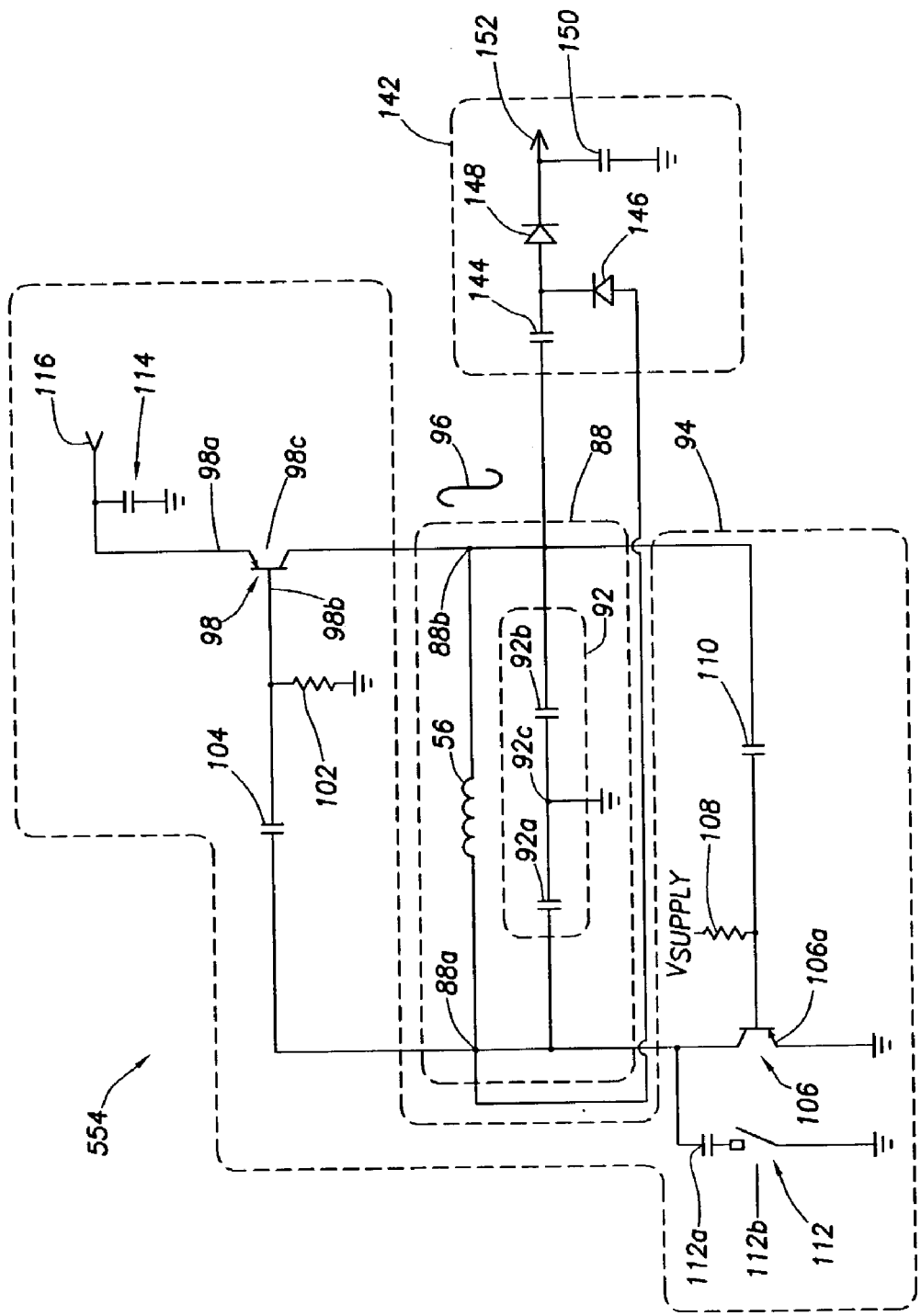
FIG. 10 is a schematic illustration of a communication circuit shown in FIG. 4 in accordance with a sixth embodiment.

Referring to both FIGS. 4 and 10, communication circuit 554 includes a voltage multiplier circuit 142 connected to tank circuit 88. Voltage multiplier circuit 142 includes a coupling capacitor 144 connected in common with a cathode of a first diode 146 and an anode of a second diode 148. A rectifying capacitor 150 is connected in series between a cathode of second diode 148 and ground. An anode cathode of first diode 146 is connected to port 88*a*. Voltage multiplier circuit 142 increases the magnitude of a signal sensed by antenna 56. When antenna 56 senses a signal, rectifying capacitor 150 charges. Once rectifying capacitor 150 is charged, coupling capacitor 144 is employed to demodulate data. Diodes 146 and 148 rectify the signals with rectified demodulated data being present at output 152, which may be transmitted to other circuitry, such as controller circuit 60. The demodulated data may then be used directly with a voltage regulator. If desired, multiple voltage multiplier circuits 142 may be coupled together in stages between tank circuit 88 and output 152. Were rectifying capacitor 150 charged in short bursts tank circuit 88 may be employed to concurrently receive power and data.

Figure 11:
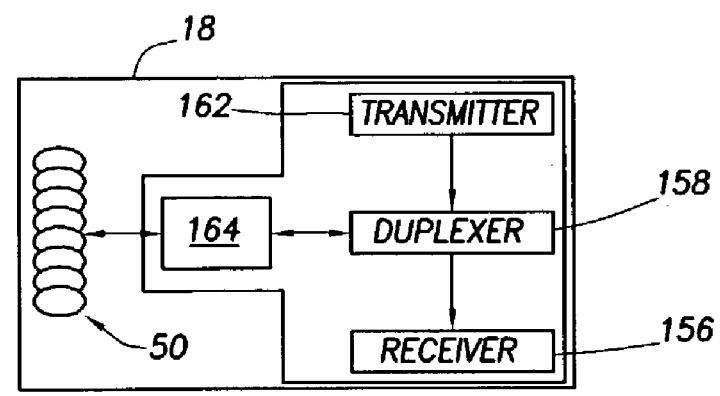
FIG. 11 is a block diagram conceptually illustrating operation of the steerable transceiver unit in conjunction with the remote sensor in accordance with the present invention.

Turning to FIGS. 2 and 11, in operation, once remote sensor 26 is emplaced, it begins collecting data. In one particular embodiment, remote sensor 26 includes a timer that periodically initiates a power up of remote sensor 26. Remote sensor 26 then acquires data, stores it in ADC/memory 66, shown in FIG. 4, and goes back to sleep. When arrayed antenna 50 is aligned with antenna 56 of remote sensor 26, collar transmitter 162, which contains a power amplifier (not shown), sends a wakeup tone to remote sensor 26 through arrayed antenna 50. The wakeup tone is transmitted at a frequency within the bandwidth of tank circuit 88, shown in FIG. 10, which is close to the resonant frequency of remote sensor 26. Remote sensor 26 receives the tone through its antenna 56 if arrayed antenna 50 is close enough, detects the received signal through the receiver wakeup electronics (not shown), and wakes up if the signal is of the desired frequency. Remote sensor 26 then sends an acknowledge signal to collar transmitter 162 and waits to receive a command.

When awakened by collar transmitter 162, remote sensor 26 is capable of receiving and executing a number of commands, such as acquire data, transmit data, memory read, and memory write. Most commonly, collar transmitter 162 will instruct remote sensor 26 to transmit data. Remote sensor 26 transmits measurement data through antenna 56 to transmitter/receiver circuitry 18 and goes back to sleep. Receiver 156 in transmitter/receiver circuitry 18 amplifies, demodulates and decodes the data. A duplexer 158 in the collar electronics protects receiver 156 in drill collar 10. Arrayed antenna 50 in drill collar 10 is tuned in resonance to the transmit frequency of the remote sensor 26 by, inter alia, a tuning circuit 164 connected between arrayed antenna 50 and duplexer 158.

More particularly, drill collar 10 is positioned in close proximity of remote sensor 26. In some implementations, drill collar 10 is actually used to emplace remote sensor 26, in which case drill collar 10 will be proximate to remote sensor 26. If remote sensor 26 was previously emplaced, its location may be determined from records regarding its emplacement. As a last resort, transceiver unit 44, shown in FIG. 3, can be used to locate remote sensor 26 by bobbing drill collar 10 in well bore 12. An electromagnetic wave is transmitted from transmitter/receiver circuitry 18 in drill collar 10 to "switch on" remote sensor 26 and to induce remote sensor 26 to send back an identifying coded signal. This "handshaking" process can be used to identify the location of remote sensor 26, since the receipt of the handshaking signal from remote sensor 26 will indicate drill collar 10 is positioned sufficiently proximate to the location of remote sensor 26.

The location of remote sensor 26 may be tracked once the location is identified. Communication between drill collar 10 and remote sensor 26 will typically occur during drilling operations, although this is not necessary to the practice of the invention. There typically will therefore be some degree of translational and rotational movement of transceiver unit 44 relative to remote sensor 26, and this movement should be tracked. This can be accomplished as discussed in U.S. Published application 2002-0167418-A1 entitled STEERABLE TRANSCEIVER UNIT FOR DOWNHOLE DATA ACQUISITION IN A FORMATION, which is incorporated by reference herein in its entirety.

A handshaking process initiates the electronics of remote sensor 26 to go into the acquisition and transmission mode, and pressure data and other data representing selected formation characteristics, as well as the sensor's identification code, are obtained at the level of remote sensor 26. Note that, in some embodiments, remote sensor 26 might continuously acquire data while the transmitter is inactive, e.g. such as in the absence of the arrayed antenna 50. At the same time pressure gauge data (pressure and temperature) and other selected formation characteristics are acquired and the electronics of remote sensor 26 convert the data into one or more serial digital signals. This digital signal or signals, as the case may be, is transmitted from remote sensor 26 back to drill collar 10 via transmitter/receiver circuitry 18. This is achieved by synchronizing and coding each individual bit of data into a specific time sequence. Data acquisition and transmission, or at least transmission (depending on the embodiment), is terminated after stable pressure and temperature readings have been obtained and successfully transmitted to the on-board circuitry of drill collar 10.

Whenever the sequence above is initiated, transmitter/receiver circuitry 18 located within drill collar 10 is powered by transceiver power drive 46. An electromagnetic wave is transmitted from drill collar 10 at a frequency determined by oscillator 48. The frequency can be selected within the range from 10 KHz to 50 MHz. As soon as remote sensor 26 comes within the zone of influence of transmitter/receiver circuitry 18, antenna 56 located within remote sensor 26 will radiate back an electromagnetic wave at twice the original frequency by means of receiver coil control circuit 84 and antenna 56.

This concludes the detailed description of particular embodiments. The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and that such variations are considered within the scope of the invention as claimed. Accordingly, the protection sought herein is as set forth in the claims below. The embodiments of the present invention described above are exemplary. Many changes and modifications may be made to the disclosure recited above, while remaining within the scope of the invention. The scope of the invention should, therefore, be determined not with reference to the above description, but instead should be determined with reference to the appended claims along with their full scope of equivalents.

The invention claimed is:

1. A wireless communication circuit, comprising;
an antenna;
a capacitor circuit connected in parallel with said antenna, defining a tank circuit having first and second ports, with said capacitor circuit including a pair of capacitors coupled in series, said pair of capacitors being connected in common to ground; and
a feedback network connected to said tank circuit to selectively bias said tank circuit to operate as a transmitter and a receiver.

2. The communication circuit as recited in claim 1 wherein said feedback network provides 360° feedback to each of said first and second ports.

3. The communication circuit as recited in claim 1 wherein said feedback network is connected to provide maximum signal swing across said antenna.

4. The communication circuit as recited in claim 1 wherein each of said pair of capacitors have substantially identical values.

5. The communication circuit as recited in claim 1 wherein each of said pair of capacitors have differing values.

6. The communication circuit as recited in claim 1 wherein said tank circuit defines a signal and said feedback network is connected to receive data to selectively encode said signal with said data.

7. The communication circuit as recited in claim 1 wherein said tank circuit defines a signal and said feedback network further includes first and second feedback circuits to allow selective encoding of said signal, with said first feedback circuit connected to said tank circuit to selectively encode said signal using amplitude shift keying techniques and said second feedback circuit connected to said tank circuit to selectively encode said signal using frequency shift keying techniques.

8. The communication circuit as recited in claim 1 further including a rectifying circuit connected in parallel to said tank circuit to rectify signals sensed by said antenna.

9. The communication circuit as recited in claim 1 further including an envelope demodulator circuit connected in common with one of said pair of capacitors and said antenna.

10. The communication circuit as recited in claim 1 further including a matched pair diode receiver circuit connected in common with one of said pair of capacitors and said antenna.

11. The communication circuit as recited in claim 1 further including a voltage multiplier connected in common with one of said pair of capacitors and said antenna.

12. A communication circuit, comprising:
   a tank circuit having an inductor connected in parallel with a capacitor circuit, said capacitor circuit including a pair of capacitors connected in series, with said pair of capacitors having first and second values associated therewith and being connected in common to ground; and
   a feedback network connected to said tank circuit to selectively bias said tank circuit to operate as a transmitter and a receiver.

13. The communication circuit as recited in claim 12 wherein said tank circuit defines a signal and said feedback network further includes a feedback circuit to allow selective encoding of said signal.

14. The communication circuit as recited in claim 12 wherein said tank circuit defines a signal and said feedback network further includes first and second feedback circuits to allow selective encoding of said signal, with said first feedback circuit connected to said tank circuit to selectively encode said signal using amplitude shift keying techniques and said second feedback circuit connected to said tank circuit to selectively encode said signal using frequency shift keying techniques.

15. The communication circuit as recited in claim 13 further including an envelope demodulator circuit connected in common with said inductor and one of said pair of capacitors.

16. The communication circuit as recited in claim 13 further including a rectifying circuit connected in parallel to said tank circuit to rectify signals sensed by said inductor.

17. The communication circuit as recited in claim 16 further including a matched pair diode receiver circuit connected in common with one of said pair of capacitors and said inductor.

18. The communication circuit as recited in claim 16 further including a voltage multiplier connected in common with one of said pair of capacitors and said inductor.

19. A method of communicating with wireless signals with a tank circuit connected to a feedback network, said method comprising:
   forming said tank circuit by connecting an antenna in parallel with a capacitor circuit so that said antenna continuously operates in resonance; and
   producing an oscillatory signal by selectively biasing said tank circuit with said feedback network to operate said tank circuit as a transmitter and a receiver.

20. The method as recited in claim 19 further including providing 360° feedback to said tank circuit with said feedback network.

21. The method as recited in claim 19 further including receiving a data signal containing information and encoding said oscillatory signal with said information.

22. The method as recited in claim 19 further including receiving a data signal containing information and encoding said oscillatory signal with said information employing FSK techniques.

23. The method as recited in claim 19 further including receiving a data signal containing information and encoding said oscillatory signal with said information employing ASK techniques.

24. The method as recited in claim 19 further including sensing common mode signals and producing a digital output.

25. The method as recited in claim 19 further including alternatingly sensing common mode signal with said antenna and transmitting differential mode signals with said antenna.

* * * * *